United States Patent [19]
Goldberg

[11] Patent Number: 5,561,676
[45] Date of Patent: Oct. 1, 1996

[54] COMPOUND-CAVITY, HIGH-POWER, MODELOCKED SEMICONDUCTOR LASER

[75] Inventor: Lew Goldberg, Fairfax, Va.

[73] Assignee: The United States of America as represented by the Secretary of the Navy, Washington, D.C.

[21] Appl. No.: 383,643

[22] Filed: Feb. 6, 1995

[51] Int. Cl.$^6$ ...................................................... H01S 3/098
[52] U.S. Cl. .............................. 372/18; 372/20; 372/22; 372/82; 372/97; 372/98; 372/92
[58] Field of Search ................................ 372/18, 22, 92, 372/98, 97, 82, 20

[56] References Cited

U.S. PATENT DOCUMENTS 5,392,308   2/1995   Welch et al. ................................. 372/92

OTHER PUBLICATIONS

Goldberg et al; "High–Power Near–Diffractio–Limited Large–Area Traveling Wave Semiconductor Amplifiers"; IEEE Journal of Quantum Electronics, vol. 29, No. 6, Jun. 1993.
Publication, "Blue Light Generation Using A High Power Modelocked Tapered Stripe Laser" by Lew Goldberg and David Mehuys, presented at Compact Blue–Green Conference, Salt Lake City, Feb. 11, 1994.
Publication, "High–Power, Near–Diffraction–Limited Large–Area Traveling–Wave Semiconductor Amplifiers", by Lew Goldberg et al., IEEE J. Quantum Electronics, vol. 29, No. 6, pp. 2028–2043 (Jun. 1993).
Publication, "Short Pulse Generation Using Multisegment Mode–Locked Semiconductor Lasers", by Dennis J. Derickson et al., IEEE J. Quantum Electronics, vol. 28, No. 10, pp. 2186–2201 (Oct. 1992).
Publication, "Generation Of 41 mW Of Blue Radiation By Frequency Doubling Of A GaAlAs Diode Laser", by W. J. Kozlovsky et al., Appl. Phys. Lett., vol. 56(23), pp. 2291–2292 (4 Jun. 1990).
Publication, "Generation Of 20 mW Of Blue Laser Radiation From A Diode–Pumped Sum–Frequency Laser" by P. N. Kean et al., Appl. Phy. Lett., vol. 63, No. 3, pp. 302–304 (19 Jul. 1993).
Publication, "1 W CW, Diffraction–Limited, Tunable External–Cavity Semiconductor Laser", by D. Mehuys et al., Electronics Letters, vol. 29, No. 14, pp. 1254–1255 (8 Jul. 1993).
Publication, "High Power Mode–Locked Compound Laser Using A Tapered Semiconductor Amplifier" by Lew Goldberg et al., IEEE Photonics Technology Letters, vol. 6, No. 9, pp. 1070–1072 (9 Sep. 1994).

*Primary Examiner*—Leon Scott, Jr.
*Attorney, Agent, or Firm*—Thomas E. McDonnell; George Jameson

[57] ABSTRACT

The invention is for a new type of an efficient and compact laser system, based on semiconductor gain medium, which produces high peak power. The laser system comprises: a compound cavity laser defined by first and second reflective elements; a developing structure, having a first end containing the first reflective element and a second end, being disposed in the compound cavity laser and being responsive to an RF frequency signal within a preselected RF frequency range for developing and reflecting from the first reflective element modelocked laser pulses at a selected wavelength; a first amplifier disposed between the developing structure and the second reflective element and being responsive to the reflected modelocked laser pulses from the developing structure for amplifying the modelocked laser pulses at the selected wavelength, the first amplifier having an end containing the second reflective element for transmitting a first portion of the amplified modelocked laser pulses therethrough and for reflecting a second portion of the amplified modelocked laser pulses back toward the developing structure; and a nonlinear element for converting the first portion of the amplified modelocked laser pulses from said first amplifier to amplified modelocked laser pulses at a desired frequency-converted wavelength.

40 Claims, 5 Drawing Sheets

COMPOUND-CAVITY, HIGH-POWER, MODELOCKED SEMICONDUCTOR LASER

BACKGROUND OF THE INVENTION

1. Field of the Invention

The present invention relates to lasers and particularly to an efficient and compact tunable optical source of high peak power coherent radiation at a desired wavelength through the use of a tuning device, modelocking, a high power large active area semiconductor amplifier and non-linear frequency conversion.

2. Description of the Related Art

Of all laser types, semiconductor lasers are the most attractive for commercial applications due to their high efficiency, compactness, low manufacturing costs, long operating lifetime, and wide choice of available wavelengths. However, many applications, such as nonlinear frequency conversion and free space and fiber optical communications, require peak powers which are well beyond the output range of not only conventional narrow stripe laser diodes, but also the recently developed diffraction limited, large active area semiconductor amplifiers. Large increases in the peak laser diode power can be achieved through the use of modelocking. Modelocked pulses, directly generated by narrow stripe semiconductor amplifiers are, however, limited to average powers below 10 milliwatts (mW), pulse energies below 10 picojoules (pJ), and peak powers below 1 watt (W). These power levels fall short by one to two orders of magnitude from those required for efficient frequency conversion.

Another approach for increasing the output power has been to use high power laser diode arrays as the active element. The average output powers however, have been relatively small, typically <10 mW. This is a consequence of the fact that large area active elements require high pump currents, and the effective modulation depth of the gain element is relatively small due to the limited available RF power of $\approx 1$ W. As a result, active modelocking can be achieved only near laser threshold, where output powers are low.

The only available lasers emitting in the commercially important blue spectral region are gas lasers such as the Argon ion laser, and the HeCd laser. Gas lasers suffer from several major deficiencies limiting their applications, particularly a very low electrical-to-optical power conversion efficiency of <0.01%. A laser with low efficiency requires high electrical power to generate optical powers above a few milliwatts, and removal of large amount of excess heat. For powers above $\approx 100$ mW, liquid cooling has to be used, which is unattractive for many applications. Although low power blue gas lasers have found several applications such as high speed laser printing, IC wafer alignment, IC mask generators, CD mastering systems, they suffer from relatively short lifetime of roughly 5,000 hours, mechanical vibration caused by the air fan, and relatively large cost in the range of $5,000–$25,000. These limitations prevent gas lasers from gaining wider commercial utilization.

Numerous solid state alternatives to the gas lasers have been proposed and demonstrated, including fiber upconversion lasers, directly frequency doubled laser diodes, sum frequency mixing between a Nd:YAG laser and a laser diode. These systems, however, have generated only limited blue output powers below approximately 50 mW, and require complex and expensive resonant cavities to achieve acceptable conversion efficiencies. The relatively low powers are due to the low power available from conventional laser diodes of <100 mW, and the resulting low nonlinear conversion efficiency.

SUMMARY OF THE INVENTION

It is therefore an object of the present invention to provide an efficient and compact optical source of high peak power coherent radiation.

Another object of the present invention is to provide a tunable, compound cavity, high power, modelocked semiconductor laser system.

Another object of the present invention is to provide a compact and efficient source of optical radiation with sufficiently high peak power to allow conversion of its emission to other wavelengths by non-linear frequency doubling or other nonlinear processes.

Another object of the present invention is to provide a compound cavity modelocked laser which uses a tapered amplifier gain element for generating high average power while using a narrow stripe gain element to obtain active modelocking through RF modulation of the cavity gain.

A further object of the present invention is to provide an efficient and compact optical source of high peak power coherent radiation at a desired wavelength through the use of modelocking, a high power large active area semiconductor amplifier, a diffraction grating and non-linear frequency conversion.

These and other objects are achieved by providing a laser system which comprises: a compound cavity laser defined by first and second reflective elements; a developing structure, having a first end containing the first reflective element and a second end, being disposed in the compound cavity laser and being responsive to an RF frequency signal within a preselected RF frequency range for developing and reflecting from the first reflective element modelocked laser pulses at a selected wavelength; a first amplifier disposed between the developing structure and the second reflective element and being responsive to the reflected modelocked laser pulses from the developing structure for amplifying the modelocked laser pulses at the selected wavelength, the first amplifier having an end containing the second reflective element for transmitting a first portion of the amplified modelocked laser pulses therethrough and for reflecting a second portion of the amplified modelocked laser pulses back toward the developing structure; and a nonlinear element for converting the first portion of the amplified modelocked laser pulses from said first amplifier to amplified modelocked laser pulses at a desired frequency-converted wavelength.

BRIEF DESCRIPTION OF THE DRAWINGS

These and other objects, features and advantages of the invention, as well as the invention itself, will become better understood by reference to the following description when considered in connection with the accompanying drawings wherein like reference numerals designate identical or corresponding parts throughout the several views and wherein.

DETAILED DESCRIPTION OF THE PREFERRED EMBODIMENTS

Before proceeding with the Detailed Description, the general purposes of the invention will now be briefly discussed to aid in the reader's understanding of the present invention.

A first purpose of the invention is to obtain an efficient and compact source of high peak power coherent radiation. This is accomplished through the use of modelocking and high power active area semiconductor gain mediums or semiconductor amplifiers. Modelocking is an operation whereby a laser emits peak powers which are much higher than its average output power, and the laser emission is a series of short regularly spaced intense pulses. Specifically, the purpose of the compound cavity laser of the invention is to make it possible to achieve efficient modelocking of a laser based on a high power large area tapered stripe, or otherwise configured, semiconductor amplifier.

A second purpose of the invention is to obtain a compact and efficient source of optical radiation with sufficiently high peak power to allow conversion of its emission to other wavelengths by nonlinear frequency doubling or other nonlinear processes. Specifically, through second harmonic generation, the second purpose of the invention is to provide the first practical, compact, and efficient all-solid state source of blue light, as required in numerous applications including large screen visual displays, optical data storage, optical printing, photolithography, medical and scientific uses.

Figure 1:
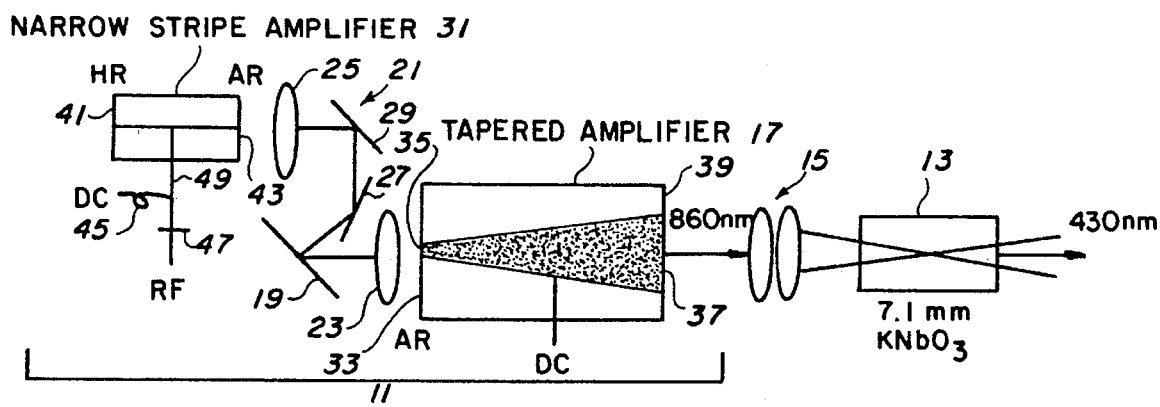
FIG. 1 illustrates a first embodiment of the compound cavity modelocked laser system of the invention.

Referring now to the drawings, FIG. 1 illustrates a first embodiment of the compound cavity modelocked laser system of the invention. The compound cavity modelocked laser system of FIG. 1 comprises a compound cavity modelocked laser 11 for emitting modelocked laser pulses at substantially 860 nm, a nonlinear frequency-doubling crystal 13 for converting the modelocked laser pulses at substantially 860 nm to blue light at a wavelength of substantially 430 nm, and an optical or lens system 15 for focusing the 860 nm modelocked laser pulses from the compound cavity modelocked laser 11 into the nonlinear crystal 13.

It should be noted at this time that a compound cavity laser contains two or more gain elements or amplifiers in the laser cavity and the gain elements are separated from each other by optical elements in that cavity. Therefore, the compound cavity modelocked laser 11 (to be explained) is a compound cavity laser which contains a structural element for modelocking the emission in its cavity.

The major components of the compound cavity laser 11 are: a tapered stripe traveling wave amplifier, tapered semiconductor amplifier or tapered amplifier 17 (or any suitable large area amplifier), a diffraction grating or grating 19, optical elements 21 (such as exemplary lenses 23 and 25 and mirrors 27 and 29), and a narrow stripe semiconductor amplifier or narrow stripe amplifier 31.

The tapered amplifier 17 is a large area amplifier which has a back facet or end 33 with an aperture 35 of a few microns in width which expands linearly along its length to an output aperture 37 of about an exemplary 130 microns in its front facet or end 39. The large area in the tapered amplifier 17 enables the tapered amplifier to produce much more output average power (about an order of magnitude higher average power) than a conventional laser diode. The narrow stripe in the narrow stripe amplifier 31 is about 5 microns single spatial mode.

The two different amplifiers 17 and 31 are preferably semiconductor amplifiers and are used in the compound cavity modelocked laser 11 in order to separate the two functions of a modelocked laser. The tapered amplifier 17 performs the function of delivering high average power, whereas the narrow stripe amplifier 31 performs the function of modulating the gain in the the compound cavity to modelock the entire compound cavity in the laser 11 in order to generate short pulses.

The tapered amplifier 17 is pumped by a DC current, in the range of about 2–3 amperes, from a DC current source (not shown). The narrow stripe amplifier 31 is biased, by way of an inductor 45 and a bias T 49, with a DC bias current from a source (not shown). In addition, an RF signal (of power ≈1 W) from a source (not shown) is superimposed on the DC bias current by way of a capacitor 47 and the bias T 49 to modulate the gain in the narrow stripe amplifier 31 at the sinusoidal rate of the RF signal current. This RF signal current can be in the frequency range of from about one-half a gigahertz (½ GHz) to about 3 GHz. This modulation of the gain in the amplifier 31 modelocks the entire compound cavity in the laser 11, forcing the laser 11 to operate with short periodically-spaced, modelocked pulses instead of CW.

Lasing in the compound cavity modelocked laser 11 occurs between the front facet 39 of the tapered amplifier 17, which front facet 39 is antireflection (AR) coated with a residual reflectivity of approximately 1%, and the back facet 41 of the narrow stripe amplifier 31, which has a reflectivity of substantially 100%. All other surfaces in the compound cavity laser 11, such as the back facet 33 of the tapered amplifier 17 and the front facet 43 of the narrow stripe amplifier 31, are AR coated in order to have a sufficiently low reflectivity to avoid formation of secondary pulses under modelocked operation (to be discussed). The grating 19 serves to reduce the spectral bandwidth of the emission from the tapered amplifier 17 in the compound cavity laser 11 and to allow wavelength tuning.

In the initial operation of the compound cavity laser 11, the application of the DC current to the tapered amplifier 17 causes the compound cavity laser 11 to produce a continuous wave (CW) laser emission in the spectral range of from about 840 nm to about 880 nm, where the amplifier 17 exhibits substantial power gain and with an average power in the range of from about ½ W to about 1 W. A small portion of this emission is reflected off the front facet 39 of the tapered amplifier 17 back through the tapered amplifier 17 and is colimated by the lens 23 before striking the diffraction grating 19. The diffraction grating 19 is set at an appropriate angle to efficiently reflect at a particular wavelength in the exemplary range of 840 nm to 880 nm, causing a laser emission centered at a wavelength of, for example, 860 nm to be reflected off the grating 19 to a mirror 27. The diffraction grating 19 enables the wavelength of the laser emission to be varied by tuning or rotating the grating 19 around the angle (not shown) between the grating 19 and the laser emission from the tapered amplifier 17. A motor (not shown) or other means (not shown) could be used to rotate the grating 19 to tune the wavelength of the laser emission from the tapered amplifier 17 to the center wavelength of 860 nm. The tuned laser emission from the grating 19 is sequentially reflected off of the mirrors 27 and 29 into the lens 25 which focuses the tuned laser emission into the narrow stripe amplifier 31.

As discussed earlier, active modelocking is obtained in the laser 11 by applying to the narrow stripe amplifier 31 both a DC bias signal by way of the inductor 45 and an RF signal ($\approx$1 W) by way of the capacitor 47 to the bias T 49, resulting in deep modulation of its gain at the RF frequency. Therefore, the tuned 860 nm laser emission that is focused by the lens 25 into the narrow stripe amplifier 31 becomes modelocked. As a result, modelocked laser pulses at substantially 860 nm are reflected off the back facet 41 of the narrow stripe amplifier 31 and passed through the amplifier 31 back to the optical elements 21. These modelocked laser pulses from the narrow stripe amplifier 31 are collimated by the lens 25, reflected off the mirrors 29 and 27 back into the diffraction grating 19 for further spectral bandwidth reduction, reflected off the diffraction grating 19, and focused by the lens 23 into the aperture 35 in the back facet 35 for amplification by the tapered amplifier 17.

After several round trip passes around the compound cavity modelocked laser 31, the laser emission in the compound cavity of the laser 11 becomes stabilized at substantially 860 nm modelocked pulses at a wavelength coarsely determined by the tapered amplifier 17 and specifically determined by the diffraction grating 19. The spacing between the modelocked pulses is determined by the period of the RF current that is used to modulate the gain of the compound cavity modelocked laser 11.

The compound cavity modelocked laser 11, when modelocked, outputs very high peak power modelocked pulses greater than 10 W. The average power of the modelocked pulses is in the range of one half (½) W to one (1) W.

Modelocked vs. CW operation is assured by the fact that the high level portion of the RF current flowing through the narrow stripe amplifier 31 coincides with the passage of one of the modelocked train of pulses through its active region. As a result, the average gain for the modelocked pulses is higher than for CW radiation which propagates through the narrow stripe amplifier 31 during both low and high level portions of the RF cycle.

The amplified 860 nm modelocked laser pulses are outputted from the output aperture 37 in the front facet 39 of the tapered amplifier 17 and focused by the lens or optical assembly 15 into the nonlinear crystal 13. To generate blue light, the nonlinear crystal 13 is comprised of potassium niobate ($KNbO_3$) to produce a frequency doubled output in order to obtain output 430 nm modelocked laser pulses. A length of 7.1 mm was selected for the $KNbO_3$ crystal.

It should be noted at this time that the invention is not limited to frequency doubling. Other types of frequency mixing are within the purview of the invention. For example the nonlinear crystal 13 could be used to produce a desired sum or difference frequency by mixing in a selected nonlinear crystal 13 the 860 nm beam from the compound cavity modelocked laser 11 and a beam from another laser incident on the crystal 13 to produce the desired sum or difference frequency. Another example is to produce frequency quadrupling of the 860 nm output from the compound cavity modelocked laser 11 by coupling the output of the nonlinear crystal 13 into another frequency doubling crystal to produce ultraviolet light at a wavelength of about 215 nm.

Operation of the compound cavity laser 11 and the blue light generation by the nonlinear crystal 13 rely on the following key factors:

- High output power is made possible by using the large active area semiconductor amplifier 17.
- Efficient modelocking is made possible by using the second narrow stripe semiconductor amplifier 31, its gain modulated using much smaller RF power than required to modulate the large area amplifier 17 itself.
- The diffraction grating 19 is used to achieve wavelength tunability and spectral narrowing of the emission.
- Peak powers generated by the compound cavity modelocked laser 11 are sufficiently high to achieve efficient nonlinear wavelength conversion in a single pass through a nonlinear crystal.

The configuration of the compound cavity modelocked laser 11 of FIG. 1 was implemented using a 2.5 mm long tapered GaAlAs heterostructure amplifier 17, with a 4 μm wide input end 35 and a 130 μm wide output end 37, and an AR coating on both of the facets 33 and 39. The narrow stripe amplifier 31 was 500 μm long, with a highly reflective coating on the back facet 41, and an AR coating on the front facet 43. Each of the amplifiers 17 and 31 had a gain maximum at 855 nm. A f=6.5 mm lens 23 was used to collimate the beam emitted from the narrow end 33 of the tapered amplifier 17, and after diffraction from the grating 19, a f=7.7 mm lens 25 coupled the beam into the narrow stripe amplifier 31. The total cavity length of the compound cavity modelocked laser 11 was adjusted to produce a $f_{mo}$=500 MHz fundamental cavity frequency.

The all-solid state blue laser system described in FIG. 1 relies on single pass frequency doubling in the nonlinear crystal 13 of the output of the compound cavity modelocked laser 11. High nonlinear conversion efficiency, achievable with existing nonlinear materials, is made possible by the very high peak diffraction limited peak powers generated by this unique laser system. The combination of a semiconductor laser source 11 and single pass frequency doubling in the nonlinear crystal 13 achieves the required characteristics of high efficiency, compactness, modulation capability, and robust operation. Powers above 100 mW are achievable with the disclosed system, significantly above other laser diode based blue sources. Electrical power to blue power conversion efficiency of approximately 1% has already been demonstrated, and an efficiency approaching 20% is achievable. The new method of blue light generation (or other wavelengths such as UV and green, which cannot be efficiently generated with existing gas or solid state lasers) constitutes the first practical source of high power blue light.

Figure 2:
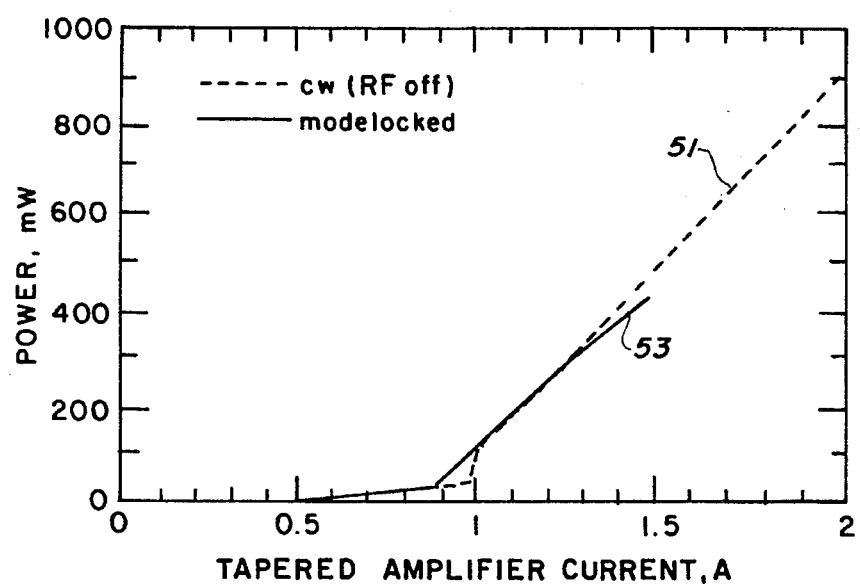
FIG. 2 shows the average output power characteristics of the compound cavity laser of FIG. 1 as a function of the tapered amplifier current I for continuous wave (RF off) and modelocked (RF on) operations.

FIG. 2 shows the average output power of the compound cavity modelocked laser 11 of FIG. 1 as a function of the tapered amplifier current for CW (RF off) and modelocked (RF on) operations. The dashed trace 51 shows where the laser 11 is operating CW, with the RF current turned off. In this CW operation, the trace 51 shows that the threshold current is about 1 A and the output power is about 900 mW at a tapered amplifier 17 current of 2 A. The solid trace 53 occurs when the RF current is turned on to modelock the compound cavity modelocked laser 11 and cause the laser 11 to produce a series of equally spaced short modelocked pulses. At this time the maximum current into the tapered amplifier 17 is about 1.5 A and maximum average output power is about 440 mW.

Figure 3:
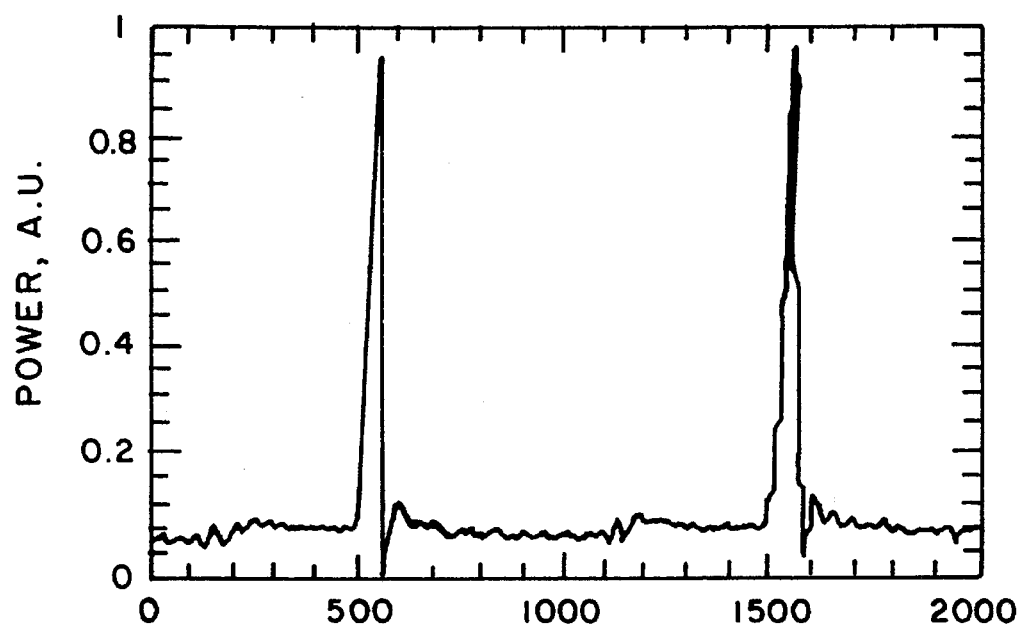
FIG. 3 shows the temporal output characteristics of the generated pulses of the compound cavity laser of FIG. 1 when the compound cavity laser is modelocked.

FIG. 3 shows the temporal output characteristics of the generated pulses of the compound cavity modelocked laser 11 of FIG. 1 when the compound cavity laser 11 is modelocked. While only two pulses are shown, it should be understood that there is a continuous stream of modelocked pulses that are equally spaced apart from each other. As shown in FIG. 3, these pulses are spaced apart by about 1000 picoseconds (ps), which is one nanosecond (1 ns). This means that the repetition rate of these pulses is 1 GHz, which is the RF frequency of the RF current in FIG. 1. Although the average output power is shown in FIG. 3 as being in arbitrary units (a.u.), the temporal characteristics of the generated pulses were monitored by a high speed photodetector and oscilloscope and found to have a peak power of 10 W–15 W and an average power on the order of a few hundred mW.

Figure 4:
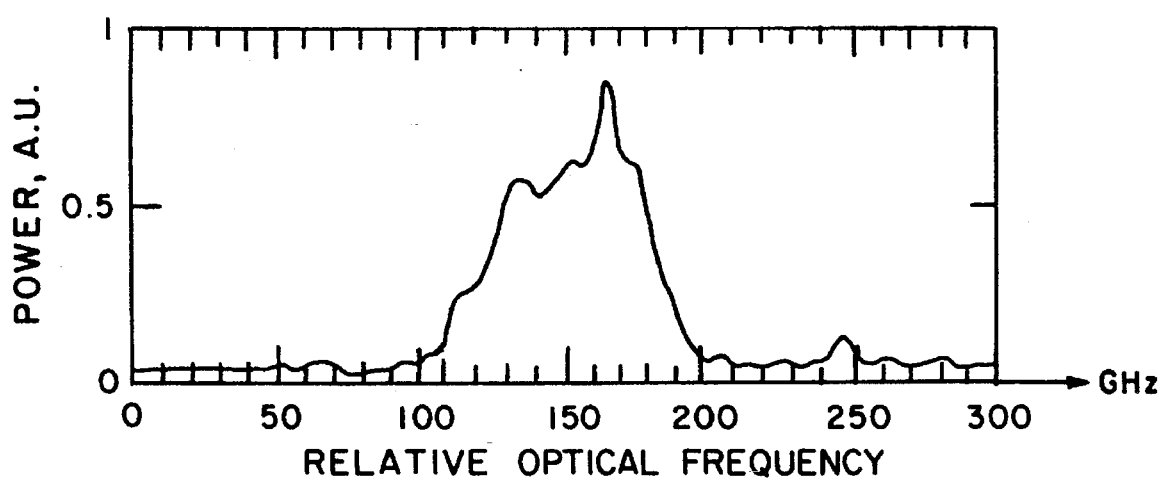
FIG. 4 shows the optical spectrum of the modelocked output of the compound cavity laser of FIG. 1.

FIG. 4 shows the optical spectrum of the modelocked output of the compound cavity laser 11 at the output or front facet 39 of the tapered amplifier 17 in FIG. 1. As can be seen in FIG. 4, the optical spectrum looks fairly triangular.

A Fabry-Perot interferometer was used to measure the modelocked laser spectrum. As shown in FIG. 4 the spectral width of the modelocked emission was 65 GHz or 1.5Å. Using the measured photodiode output voltage, the peak pulse power $P_p$ was determined to be $P_p$=11 W for conditions in FIG. 3 ($f_m$=1.0 GHz), increasing to 16 W for $f_m$=0.5 GHz, I=1.5 A, and $I_b$=20 mA. A maximum pulse energy of approximately 300 pJ, and average power of 500 mW were achieved. These values of peak power, average power, and pulse energy are more than an order of magnitude larger than those produced by conventional narrow stripe modelocked semiconductor lasers.

Figure 5:
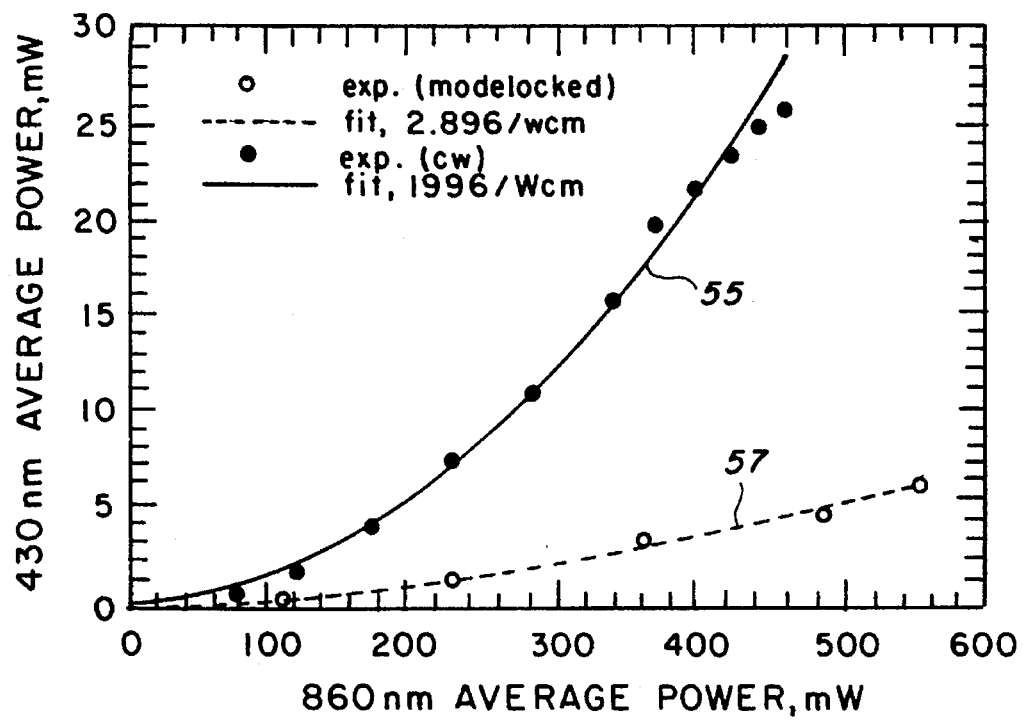
FIG. 5 shows the frequency-doubled, average blue power output from the laser system output of FIG. 1, measured under modelocked and continuous wave (RF turned off) operations.

FIG. 5 shows the frequency-doubled, average blue power output from the laser system output of FIG. 1, measured under modelocked and continuous wave (RF turned off) operations. More specifically, this blue light generation at 430 nm was carried out by frequency doubling of the compound cavity modelocked laser 11 operating at 860 nm. Infrared light emitted by the modelocked laser 11 was optimally focused (after shaping by spherical and cylindrical optics 15 to produce a Gaussian profile) into an a-cut 7.1 mm long $KNbO_3$ crystal 13, AR coated on both sides. Phase-matching was at room temperature and no temperature stabilization of the crystal was used. Modelocking was carried out at 1.5 GHz. In CW operation 6.0 mW of blue power was generated. Under modelocking, a maximum of 25 mW was generated.

The solid dots in the solid trace 55 in FIG. 5 show a plot of the average blue power that is produced at the output of the frequency-doubling nonlinear $KNbO_3$ crystal 13 when the compound-cavity laser 11 is modelocked. On the other hand, the open dots in the dashed trace 57 show a plot of the average blue power that is produced at the output of the frequency-doubling nonlinear $KNbO_3$ crystal 13 when the compound-cavity laser 11 is operated in a CW mode. The traces 55 and 57 show that the average blue power produced at the output of the $KNbO_3$ crystal 13 is about 6 times higher when the laser 11 is modelocked than when it is operating CW.

Figure 6:
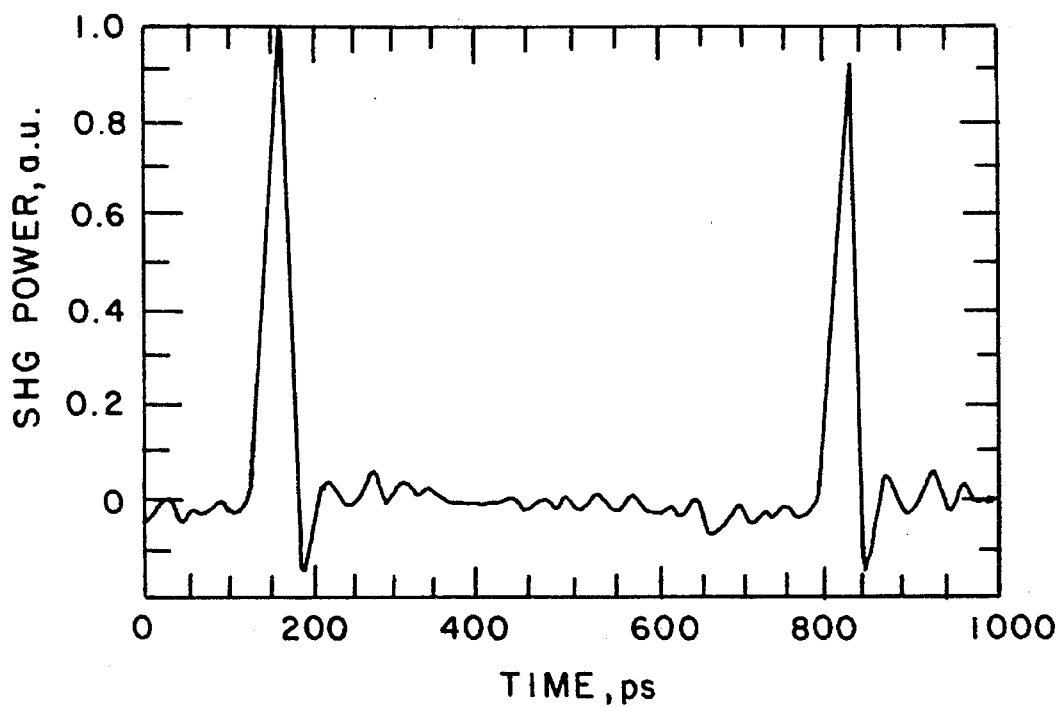
FIG. 6 shows the temporal characteristics of the blue light pulses at the laser system output of FIG. 1.

FIG. 6 shows the temporal characteristics of the blue light pulses at the laser system output of FIG. 1. FIG. 6 shows a series of short pulses that have a pulsewidth of about 12 ps and are separated from each other by about 500 ps. As can be seen, the repetition frequency of these pulses is about 1.5 GHz. Thus, 1.5 GHz is also the RF frequency of the RF current that is used to modulate the gain of the narrow stripe amplifier 31 to produce the modelocked pulses in the laser 11. The peak power of the blue pulses is about 1.4 W, while the average power of the blue pulses is a maximum of about 25 mW. The term "SHG" in FIG. 6 means second harmonic generation or second harmonic power.

Figure 7:
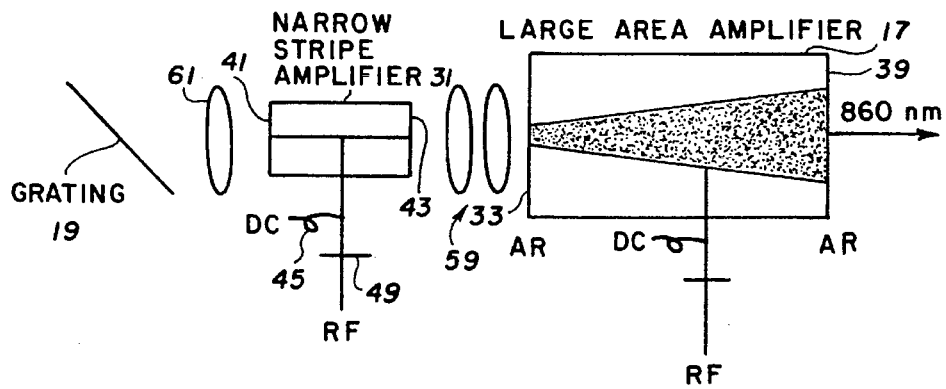
FIG. 7 illustrates a second embodiment of the compound cavity modelocked laser configuration of the invention.

FIG. 7 illustrates a second embodiment of the compound cavity modelocked laser 11 configuration of the invention. This second embodiment of FIG. 7 is a modification of the first embodiment of FIG. 1, wherein, as shown in FIG. 7, the narrow stripe amplifier 31 is placed between the grating 19 and the large area amplifier 17, and the DC bias of both of the amplifiers 31 and 17 can be modulated by an RF current to modelock the laser 11 to produce modelocked laser pulses. Here the facets 41 and 43 of the narrow stripe amplifier 31 are respectively HR and AR coated.

In the operation of the compound cavity modelocked laser 11 of FIG. 7, modelocked 860 nm light from the narrow back facet 33 of the large area or tapered amplifier 17 is collimated and focused by a lens or optical system 59 into the narrow stripe amplifier 31. Here the back facet 41 of the narrow stripe amplifier 31 is anti-reflection (AR) coated so that the modelocked 860 nm light passes through the facet 41, is collimated by a lens or optics 61 and is incident on the grating 19. As stated before, the grating 19 reduces the spectral bandwidth of the modelocked laser emission centered at 860 nm and allows wavelength tuning to the exemplary desired 860 nm center wavelength in the laser emission. The grating 19 reflects the tuned, 860 nm modelocked pulses back through the narrow stripe amplifier 31 back toward the large area amplifier 17.

With the implementation of the embodiment of FIG. 7, lasing takes place between the grating and the front facet 39 of the large area amplifier 17. Thus, the embodiment of FIG. 7 is different from the embodiment of FIG. 1. An advantage of the embodiment of FIG. 7 is that it can lead to a more compact implementation of the invention.

Figure 8:
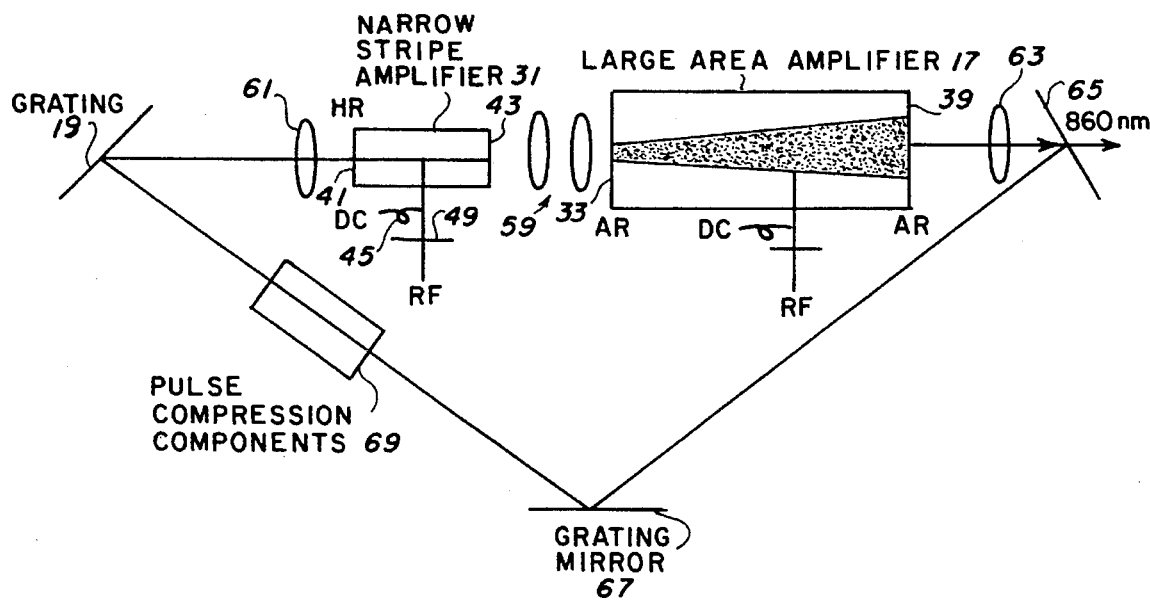
FIG. 8 illustrates a third embodiment of the compound cavity modelocked laser configuration of the invention.

FIG. 8 illustrates a third embodiment of the compound cavity modelocked laser 11 configuration, arranged in a ring cavity configuration where the light propagates in a triangular path forming a ring. The third embodiment of FIG. 8 is a modification of the second embodiment of FIG. 7, wherein, as shown in FIG. 8, additional elements are utilized between the facet 39 of the large area amplifier 17 and the grating 19 to form the ring cavity configuration.

In the operation of this third embodiment, 860 nm modelocked laser pulses from the front facet 39 of the large area amplifier 17 are collimated by a lens or optical system 63 and directed to a partially transmissive mirror 65. A first portion of the 860 nm modelocked laser pulses passes through the mirror 65 as output 860 nm modelocked laser pulses, while a second portion is reflected off the mirror 65, then reflected off a grating or mirror 67, and then passed through pulse compression components 69 to the grating 19. The grating 19, lens or optics 61, narrow stripe amplifier 31, lens or optical system 59 and large area amplifier 17 operate as described before and therefore require no further description.

The pulse compression components or elements 69, which may be a pair of diffraction gratings or prisms (not shown), superimpose in time different wavelength emission components from the amplifiers 31 and 17. The use of such pulse compression elements 69 can lead to shorter modelocked pulses in the ring cavity shown in FIG. 8 by compensating for a chirping in the ring cavity that takes place when short pulses propagate through the semiconductor amplifiers 31 and 17.

Figure 9:
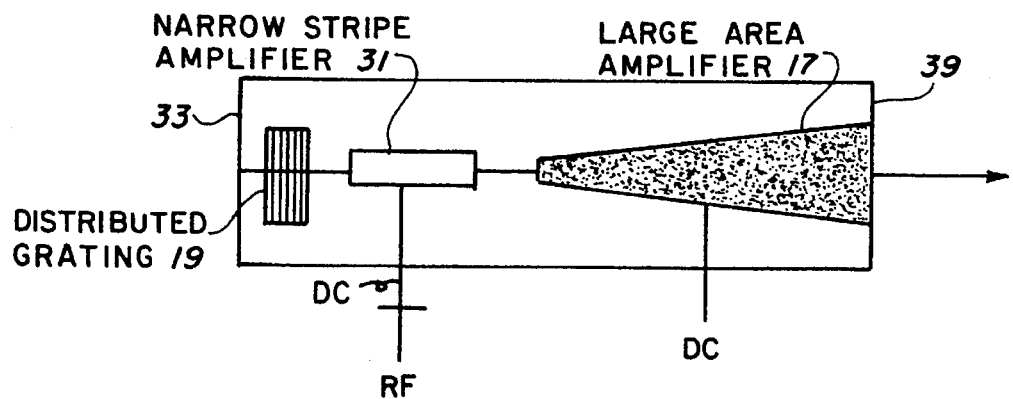
FIG. 9 illustrates an exemplary monolithic integration of all of the vertical components of FIG. 7 on a single semiconductor chip for a fourth embodiment.

FIG. 9 illustrates an exemplary monolithic integration of all of the vertical components (the large area amplifier 17, narrow stripe amplifier 31 and diffraction grating 19) of the compound cavity modelocked laser 11 of FIG. 7 on a single semiconductor chip for a fourth embodiment. Here the narrow stripe amplifier 31 electrode is electrically isolated from that of the large area amplifier 17 to allow independent gain modulation.

Figure 10:
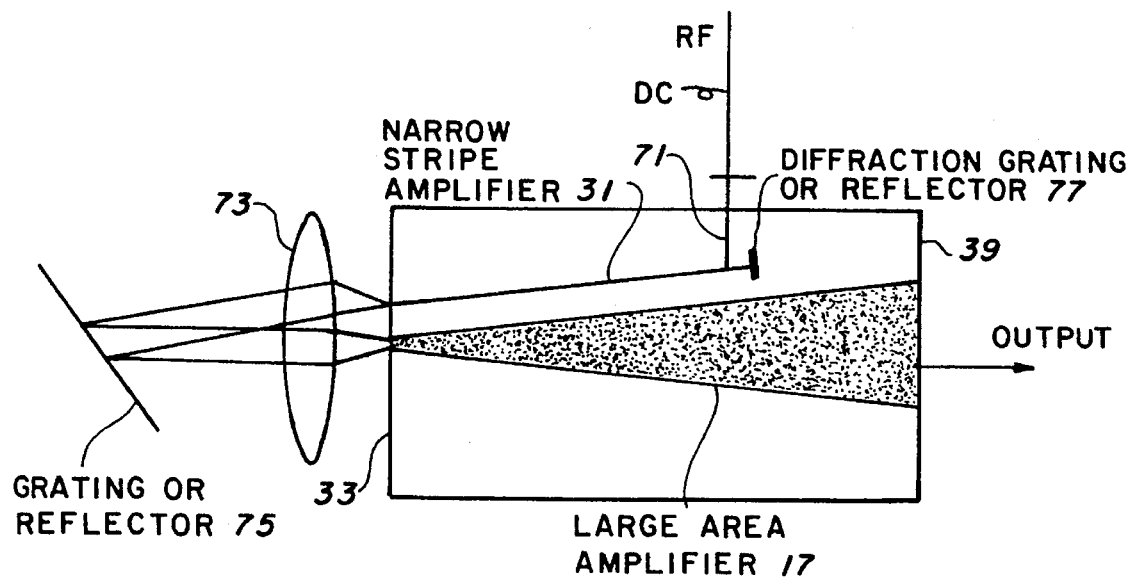
FIG. 10 illustrates a fifth embodiment of the compound cavity modelocked laser configuration of the invention.

FIG. 10 illustrates a fifth embodiment of the compound cavity modelocked laser 11 configuration of the invention. In the fifth embodiment of FIG. 10, the narrow stripe amplifier 31, contacted with a separate electrode 71, is adjacent to the large area amplifier 17. Light from the large area amplifier 17 is coupled into the narrow stripe amplifier 31 by a lens 73 and an external diffraction grating or mirror 75. The narrow stripe amplifier 31 is terminated by a monolithically integrated Bragg grating reflector or a simple reflector 77 made by etching a well at the end of the narrow stripe amplifier 31. The back facet 33 of the large area amplifier 17 is AR coated to minimize the formation of multiple parasitic pulses. The small tilt of the narrow stripe amplifier 31 relative to the back facet 33 further reduces the effective reflectivity for the light coupled in or out of the narrow stripe amplifier 31.

ADVANTAGES AND NEW FEATURES OF THE INVENTION

When compared with solid state or gas lasers major advantages of the new modelocked semiconductor laser are much larger electrical to optical conversion efficiency, smaller overall size and weight and potentially low cost. The conversion efficiency of semiconductor lasers approaches 50%, while diode pumped solid state (lamp pumped lasers are even less efficient) laser efficiencies are typically an order of magnitude lower. Another advantage is that the mode locked laser based on semiconductor amplifiers can be intensity modulated at high rates by varying the pump current to one or both of the amplifiers in the cavity. Direct modulation of other types of solid state or gas lasers can only occur at very slow rates due to the very long upper state lifetimes, which for solid state gain medium is on the order of 100 μm. The compound cavity laser can be continuously tuned over the entire gain bandwidth of semiconductor amplifiers, typically 30 nm. This is much wider than the tuning range of existing diode pumped solid state lasers. Finally the compound cavity configuration described in the invention disclosure can be implemented with a variety of semiconductor amplifier material compositions. Using demonstrated laser diode materials, this makes it possible to create compound cavity lasers throughout the 630 nm to 2.0 μm range.

When compared with other modelocked laser diodes, the unique features of the new laser are that efficient modelocking can be obtained at very high average powers because of the two gain element configuration. Consequently, the peak power levels are significantly higher than those available from conventional modelocked laser diodes.

When used for nonlinear frequency conversion into the blue, the compound laser constitutes an efficient and compact source of blue radiation. At this wavelength the efficiency and compactness advantages are even more significant since currently the only commercially available coherent optical sources operating in the blue spectral region are gas lasers. The method described can generate output powers of hundreds of mW, significantly higher than possible with conventional direct frequency doubling of cw laser diodes. In addition, other laser diode frequency doubling schemes rely on optical field enhancement of the low power laser diode output in a resonant cavity, requiring precise frequency control of the laser diode to match the cavity resonance wavelength. The laser source described here requires no frequency stabilization because of efficient single pass frequency conversion.

Therefore, what has been described is a tunable, compound-cavity, modelocked laser which uses a tapered amplifier for generating high average power, a diffraction grating for fine wavelength tuning of the output, and a narrow stripe amplifier to obtain active modelocking through RF modulation of the cavity gain. A nonlinear frequency conversion apparatus may be coupled to the tapered amplifier to frequency convert the modelocked laser pulses to a different wavelength, through the generation of second, third, fourth or higher harmonics, as well as sum and difference frequency generation. The compound cavity laser can also be used as a pump for a nonlinear crystal optical parametric oscillator (OPO).

It should therefore readily be understood that many modifications and variations of the present invention are possible within the purview of the claimed invention. For example, in addition to the above-discussed six different embodiments, more than one large area amplifier can be used in series, no frequency multiplication or mixing may be needed for certain applications, particularly with the development of new tapered or large area amplifiers made from materials that could produce different wavelength spectrums. It is therefore to be understood that, within the scope of the appended claims, the invention may be practiced otherwise than as specifically described.

What is claimed and desired to be secured by letters patent of the U.S. is:

1. A laser system comprising:
    a compound cavity laser defined by first and second reflective elements;
    developing means, having a first end containing said first reflective element and a second end, being disposed in said compound cavity laser, said developing means having an optical gain which is modulated by an input RF frequency signal within a preselected RF frequency range for developing modelocked laser pulses at a selected wavelength, said first reflective element reflecting said modelocked laser pulses at a selected wavelength; and
    a first amplifier disposed between said developing means and said second reflective element for amplifying the modelocked laser pulses from said developing means at the selected wavelength, said first amplifier having an end containing said second reflective element for transmitting a first portion of the amplified modelocked laser pulses therethrough and for reflecting a second portion of the amplified modelocked laser pulses back toward said developing means.

2. The laser system of claim 1 further including:
    nonlinear means for converting the first portion of the amplified modelocked laser pulses from said first amplifier to amplified modelocked laser pulses at a desired frequency-converted wavelength.

3. The laser system of claim 2 wherein:

said nonlinear means is a frequency doubler crystal.

4. The laser system of claim 3 wherein:

said compound cavity laser produces an output at substantially 860 nm; and said frequency doubler crystal is responsive to the substantially 860 nm output from said compound cavity laser for producing an output of the laser system at substantially 430 nm.

5. The laser system of claim 4 wherein:

said frequency doubler crystal is $KNbO_3$.

6. The laser system of claim 2 wherein:

said nonlinear means is a crystal responsive to the modelocked laser pulses at the selected wavelength and to an external signal at a different wavelength for producing the desired frequency-converted wavelength at the difference frequency wavelength between the selected and different wavelengths.

7. The laser system of claim 2 wherein:

said nonlinear means is a crystal responsive to the modelocked signal pulses at the preselected wavelength and to an external signal at a different wavelength for producing the desired wavelength at the sum frequency wavelength of the preselected and different wavelengths.

8. The laser system of claim 2 wherein said nonlinear means comprises:

first nonlinear crystal means coupled to said first amplifier for doubling the frequency of the first portion of the amplified modelocked laser pulses to produce frequency-doubled laser pulses; and second nonlinear crystal means responsive to first frequency doubled output laser pulses for doubling the frequency of the frequency-doubled laser pules to produce frequency quadrupled output laser pulses.

9. The laser system of claim 8 wherein the selected wavelength of the first portion of the amplified modelocked laser pulses is about 860 nm, and wherein:

said first nonlinear crystal means is comprised of a $KNbO_3$ crystal responsive to the selected wavelength of about 860 nm from said first amplifier for producing tunable blue light at wavelengths around 430 nm; and said second nonlinear crystal means is comprised of a BBO crystal responsive to the blue light from said first nonlinear crystal means for producing ultra violet light at wavelengths around 215 nm.

10. The laser system of claim 2 wherein said nonlinear means comprises:

first nonlinear crystal means coupled to said first amplifier for doubling the frequency of the first portion of the amplified modelocked laser pulses to produce frequency-doubled laser pulses; and second nonlinear crystal means responsive to the first frequency doubled output laser pulses and to an external optical signal at a selected frequency for producing frequency tripled output laser pulses.

11. The laser system of claim 10 wherein:

said compound laser cavity produces an output at substantially 860 nm; and said frequency doubler crystal is responsive to the substantially 860 nm output from said compound cavity laser for producing an output of the laser system at substantially 430 nm.

12. The laser system of claim 11 wherein:

said frequency doubler crystal is $KNbO_3$.

13. The laser system of claim 2 wherein said nonlinear means comprises:

first nonlinear crystal means coupled to said first amplifier for doubling the frequency of the first portion of the amplified modelocked laser pulses to produce frequency-doubled laser pulses; and second nonlinear crystal means responsive to the first frequency doubled output laser pulses and to an external optical signal at a selected frequency for producing sum frequency output laser pulses.

14. The laser system of claim 2 wherein said nonlinear means comprises:

first nonlinear crystal means coupled to said first amplifier for doubling the frequency of the first portion of the amplified modelocked laser pulses to produce frequency-doubled laser pulses; and second nonlinear crystal means responsive to the first frequency doubled output laser pulses and to an external optical signal at a selected frequency for producing difference frequency output laser pulses.

15. The laser system of claim 1 wherein said developing means comprises:

means coupled to said first amplifier for tuning the second portion of the amplified modelocked laser pulses reflected from said first amplifier to the selected wavelength; and a second amplifier having said first end containing said first reflective element, said second amplifier being responsive to the RF frequency signal within a preselected RF frequency range and to the tuned second portion of the amplified modelocked laser pulses for developing modelocked laser pulses at the selected wavelength.

16. The laser system of claim 15 wherein said tuning means comprises:

a rotatable diffraction grating disposed between said first and second amplifiers for tuning the second portion of the amplified modelocked laser pulses to the selected wavelength within said wavelength range as a function of the angle of rotation of said grating with respect to said first amplifier; and optical means for directing the tuned second portion of the amplified modelocked laser pulses between said first and second amplifiers by way of said rotatable diffraction grating.

17. The laser system of claim 15 wherein:

said first amplifier is a tapered amplifier; and said second amplifier is a narrow stripe amplifier.

18. The laser system of claim 17 wherein said tuning means comprises:

a rotatable diffraction grating disposed between said first and second amplifiers for tuning the second portion of the amplified modelocked laser pulses to the selected wavelength within said wavelength range as a function of the angle of rotation of said grating with respect to said first amplifier; and optical means for directing the tuned second portion of the amplified modelocked laser pulses between said first and second amplifiers by way of said rotatable diffraction grating.

19. The laser system of claim 18 wherein:

said optical means includes first means for collimating the tuned second portion of the amplified modelocked laser pulses and directing that collimated tuned second portion into said second amplifier and second means for focusing the tuned second portion of the amplified modelocked laser pulses into said first amplifier.

20. The laser system of claim 1 wherein said developing means comprises:

a second amplifier being responsive to the RF frequency signal within a preselected RF frequency range and to the second portion of the amplified modelocked laser pulses for developing modelocked laser pulses; and means coupled between said second reflective element and said second amplifier for tuning the second portion of the amplified modelocked laser pulses from said second amplifier to the selected wavelength, said tuning means containing said second reflective means for reflecting the amplified modelocked laser pulses at the selected wavelength back through the second amplifier to said first amplifier.

21. The laser system of claim 20 further including:

nonlinear means for converting the first portion of the amplified modelocked laser pulses from said first amplifier to amplified modelocked laser pulses at a desired frequency-converted wavelength.

22. The laser system of claim 21 wherein said tuning means comprises:

a rotatable diffraction grating disposed between said second reflection means and said second amplifier for tuning the second portion of the amplified modelocked laser pulses to the selected wavelength within said wavelength range as a function of the angle of rotation of said grating with respect to said first amplifier; and optical means for directing the tuned second portion of the amplified modelocked laser pulses between said second reflection means and said second amplifiers by way of said rotatable diffraction grating.

23. The laser system of claim 22 wherein:

said first amplifier is a tapered amplifier; and said second amplifier is a narrow stripe amplifier.

24. The laser system of claim 23 wherein said tuning means comprises:

a rotatable diffraction grating disposed between said second reflection means and said second amplifier for tuning the second portion of the amplified modelocked laser pulses to the selected wavelength within said wavelength range as a function of the angle of rotation of said grating with respect to said first amplifier; and optical means for directing the tuned second portion of the amplified modelocked laser pulses between said second reflection means and said second amplifiers by way of said rotatable diffraction grating.

25. The laser system of claim 24 wherein:

said optical means includes first means for collimating the tuned second portion of the amplified modelocked laser pulses and directing that collimated tuned second portion into said second amplifier and second means for focusing the tuned second portion of the amplified modelocked laser pulses into said first amplifier.

26. The laser system of claim 20 wherein:

said nonlinear means is a frequency doubler crystal.

27. The laser system of claim 18 wherein:

said nonlinear means is a crystal responsive to the modelocked laser pulses at the selected wavelength and to an external signal at a different wavelength for producing the desired frequency-converted wavelength at the difference frequency wavelength between the selected and different wavelengths.

28. The laser system of claim 18 wherein:

said nonlinear means is a crystal responsive to the modelocked signal pulses at the preselected wavelength and to an external signal at a different wavelength for producing the desired wavelength at the sum frequency wavelength of the preselected and different wavelengths.

29. The laser system of claim 18 further including:

output means coupled to said first amplifier for transmitting a first part of the first portion of the amplified modelocked laser pulses therethrough as output pulses and for reflecting a second part of the first portion of the amplified modelocked laser pulses along a first optical path;

reflective means for reflecting the second part of the first portion of the amplified modelocked laser pulses along a second optical path; and pulse compression components disposed in the second optical path between said reflective compression components and said tuning means for shortening the width of the amplified modelocked laser pulses passing therethrough to said tuning means.

30. A laser system comprising:

a compound cavity laser defined by first and second reflective elements forming a reflective path therebetween;

a tapered semiconductor amplifier disposed in said compound cavity laser for developing a relatively high average power emission at a preselected first wavelength, said tapered semiconductor amplifier having a narrow aperture at a first end of said tapered semiconductor amplifier and a wide output aperture at a second end of said tapered semiconductor amplifier, said second end containing said second reflective element, said second reflective element having a low transmissivity at the preselected first wavelength for passing a relatively small amount of the relatively high average power out of said compound laser cavity;

a narrow stripe semiconductor amplifier disposed in said compound cavity laser and having a high reflectivity end comprised of said first reflective element and an antireflective end for passing thereinto the emission from said narrow aperture of said tapered semiconductor amplifier, said narrow stripe semiconductor amplifier being responsive to an RF frequency signal for modulating the gain of said narrow stripe semiconductor amplifier at the RF frequency of the RF frequency signal to modelock the emission passing therethrough;

means disposed in said compound cavity laser between said tapered semiconductor amplifier and said narrow stripe semiconductor amplifier for tuning the modelocked emission to a preselected wavelength and passing said tuned modelocked emission between said narrow stripe semiconductor amplifier and said tapered semiconductor amplifier; and nonlinear means for converting the modelocked emission at the preselected wavelength to a desired wavelength.

31. A laser system comprising:

a compound cavity laser containing a first semiconductor amplifier for developing a relatively high power emission within a wavelength range determined by said first semiconductor amplifier, means coupled to said first semiconductor amplifier for tuning said emission to a selected wavelength within said wavelength range, and a second semiconductor amplifier for receiving the selected wavelength from said tuning means, said second semiconductor amplifier having an optical gain which is modulated by an input RF signal within a preselected RF frequency range for developing modelocked signal pulses at said selected wavelength; and nonlinear means for converting the modelocked signal pulses at the selected wavelength to a desired wavelength.

32. The laser system of claim 31 wherein said tuning means comprises:

a rotatable diffraction grating disposed between said first and second amplifiers for tuning said emission to a selected wavelength within said wavelength range as a function of the angle of rotation of said grating with respect to said first amplifier; and optical means for directing emission between said first and second semiconductor amplifiers by way of said rotatable diffraction grating.

33. The laser system of claim 31 wherein:

said first amplifier is a tapered amplifier; and said second amplifier is a narrow stripe amplifier.

34. The laser system of claim 33 wherein said tuning means comprises:

a rotatable diffraction grating disposed between said first and second amplifiers for tuning said emission to a selected wavelength within said wavelength range as a function of the angle of rotation of said grating with respect to said first amplifier; and optical means for directing emission between said first and second amplifiers by way of said rotatable diffraction grating.

35. The laser system of claim 34 wherein:

said optical means includes first means for collimating the tuned emission and directing that collimated emission into said second amplifier and second means for focusing the tuned emission into said first amplifier.

36. The laser system of claim 31 wherein:

said nonlinear means is a frequency doubler crystal.

37. The laser system of claim 36 wherein:

said compound cavity laser produces an output at substantially 860 nm; and said frequency doubler crystal is responsive to the substantially 860 nm output from said compound cavity laser for producing an output of the laser system at substantially 430 nm.

38. The laser system of claim 37 wherein:

said frequency doubler crystal is $KNbO_3$.

39. The laser system of claim 31 wherein:

said nonlinear means is a crystal responsive to the modelocked signal pulses at the preselected wavelength and to an external signal at a different wavelength for producing the desired wavelength at the difference frequency wavelength between the preselected and different wavelengths.

40. The laser system of claim 31 wherein:

said nonlinear means is a crystal responsive to the modelocked signal pulses at the preselected wavelength and to an external signal at a different wavelength for producing the desired wavelength at the sum frequency wavelength of the preselected and different wavelengths.

* * * * *